United States Patent [19]

Morikawa et al.

[11] Patent Number: 5,003,131
[45] Date of Patent: Mar. 26, 1991

[54] CONNECTION STRUCTURE BETWEEN CERAMIC BODY AND OUTER TERMINAL

[75] Inventors: Asao Morikawa; Kazuo Kondo, both of Nagoya, Japan

[73] Assignee: NKG Spark Plug Co., Ltd., Tokyo, Japan

[21] Appl. No.: 404,998

[22] Filed: Sep. 8, 1989

[30] Foreign Application Priority Data

Sep. 14, 1988 [JP] Japan .............................. 63-231348

[51] Int. Cl.$^5$ .......................... H05K 1/00; H01R 4/02
[52] U.S. Cl. ................................. 174/261; 174/94 R; 174/264; 174/267; 228/180.2
[58] Field of Search ............. 174/261, 264, 267, 94 R; 228/123, 180.2, 179

[56] References Cited

U.S. PATENT DOCUMENTS

| | | | |
|---|---|---|---|
| 3,621,442 | 11/1971 | Racht et al. ...................... | 174/267 X |
| 3,726,002 | 4/1973 | Greenstein et al. .............. | 174/264 X |
| 4,321,617 | 3/1982 | Duda et al. ....................... | 228/123 X |
| 4,418,857 | 12/1983 | Ainslie et al. ..................... | 228/180.2 |

FOREIGN PATENT DOCUMENTS

| | | | |
|---|---|---|---|
| 247617 | 12/1987 | European Pat. Off. ............ | 361/414 |
| 265631 | 5/1988 | European Pat. Off. ............ | 361/405 |
| 1268 | 1/1989 | Japan ................................... | 361/414 |

*Primary Examiner*—Morris H. Nimmo
*Attorney, Agent, or Firm*—Sughrue, Mion, Zinn, Macpeak & Seas

[57] ABSTRACT

A device for connecting a metal conductor on a surface of a first ceramic body to an outer terminal in which dispersion of copper metal into adjoining layers is prevented. An outer surface conductor made of Cu or Au is connected to the metal conductor on the surface of the ceramic body and extends through a throughhole in a second ceramic body. A lower conductive layer of Pd is formed over and in electrical connection with the outer end of the outer surface conductor, the lower layer having an area greater than the area of the outer end of the outer surface conductor. A dispersion-preventing layer is formed on a portion of the lower layer concentric with the outer end of the outer surface conductor, the dispersion-preventing layer having an area greater than the area of the outer end of the outer surface conductor but less than the area of the lower layer. The dispersion-preventing layer is made of a crystallized glass material. An upper conductive layer is formed over the dispersion-preventing layer and a portion of the lower layer, the upper conductive layer having an area greater than the area of the dispersion-preventing layer but less than the area of the lower layer. A soldering layer formed over the upper layer and a portion of the lower layer in electrical contact with the upper layer and the lower layer, the outer terminal being connected to the soldering layer.

7 Claims, 1 Drawing Sheet

CONNECTION STRUCTURE BETWEEN CERAMIC BODY AND OUTER TERMINAL

BACKGROUND OF THE INVENTION

1. Field of the Invention

The invention relates to a connection structure between a ceramic body and an outer terminal, and particularly concerns a connection structure capable of preventing a metallic conductor from being alloyed into a soldering layer, and which is used for a ceramic package, ceramic multi-layer base and ceramic package particularly adapted for use at high frequencies.

2. Description of Prior Art

In a pin-grid array (PGA) package as shown in FIG. 3, a ceramic package body 101 has a ceramic body 111, and a surface conductor 112 made of Cu-based metal. On the surface conductor 112, an electrode layer 102 is coated which is made of Pt, Pd or Ni-Fe alloy based metal. On the electrode layer 102, an Ag-soldering layer 103 is coated to connect an outer terminal 104 to the ceramic package body 101.

However, Cu disperses into the electrode layer 102 to form a dispersion layer 102a during the sintering process. Ag melted when the outer terminal 104 is connected to a the soldering layer 103 disperses into the surface conductor 112 located in a throughhole, as seen at arrow X in FIG. 3. The Ag thus dispersed amalgamates with the copper to form spherical body so as to lead electrical bodies, which can disrupt the electrical connection.

This holds true in the case in which the surface conductor is made of Au-based metal instead of Cu-based metal.

It is appreciated that instead of Cu the surface conductor 112 may be made of Pt or Pd which do not easily amalgamate with Ag, but these metals are not in general use since they are expensive and have a high electrical resistance of about ten times that of Cu and Au.

SUMMARY OF THE INVENTION

Therefore, the invention has as an object the elimination of all the above drawbacks.

It is specifically an object of this invention to provide a connection structure between a ceramic body and an outer terminal which is capable of avoiding disconnection due to amalgamation with and which has good electrical characteristics.

According to the present invention, there is provided a connection structure between a ceramic body and an outer terminal in which an outer surface of the ceramic body has a Cu-based or Au-based metallic conductor, and including an electrode layer coated on an outer surface of the metallic conductor, and a soldering layer made of Ag-based metal to connect the outer terminal to the ceramic body; the electrode layer comprising: a lower layer coated on an outer surface of the metallic conductor; a dispersion-preventing layer formed of crystallized glass and provided to coat at least portions of the lower layer into which Cu or Au is dispersed, and to prevent Cu, Au or Ag from being dispersed; and an upper layer coated on the dispersion-preventing layer.

Various other objects and advantages to be obtained by the present invention will appear in the following description and in the accompanying drawings.

DESCRIPTION OF THE PREFERRED EMBODIMENTS

Figure 1:
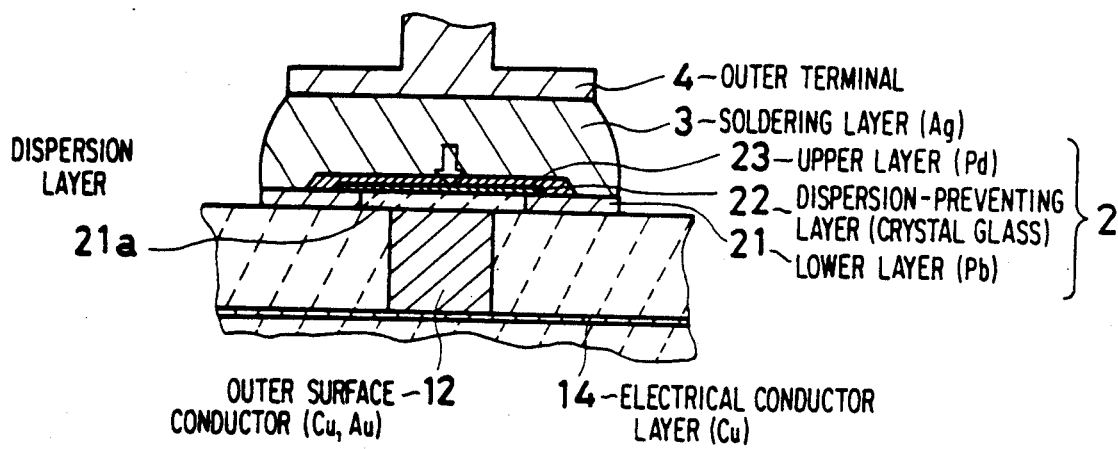
FIG. 1 is an enlarged cross sectional view of a main part of a ceramic package according to the invention.
Figure 2:
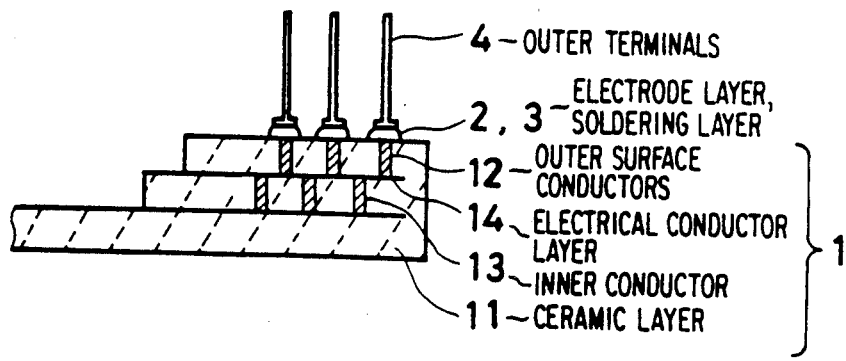
FIG. 2 is a partly sectioned view of the ceramic package of FIG. 1.
Figure 3:
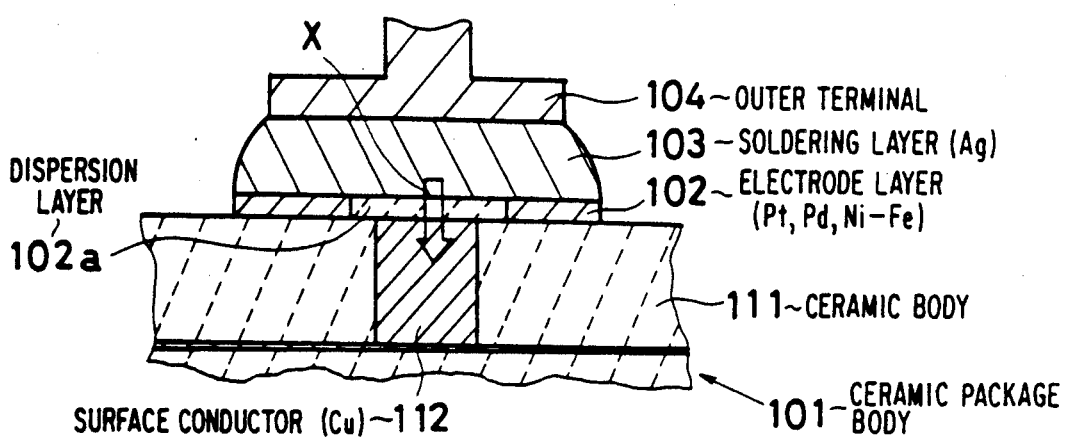
FIG. 3 is a view similar to FIG. 1 shown for the purpose of describing the prior art.

Referring to FIGS. 1 and 2, a connection structure according to this invention is shown. The structure includes a ceramic body (package body) 1, an electrode layer 2 and a soldering layer 3. The ceramic body 1 is composed of a ceramic layer 11, and an inner conductor 13 and an electrical conductor layer 14. The ceramic layer 11 is made of a crystallized glass which has at least five components selected from a group of compounds such as $ZnO$, $MgO$, $Al_2O_3$, $SiO_2$, $B_2O_3$, $P_2O_5$ and $ZrO_2$, as listed in the following Table. The electrical conductor layer 14 is made of Cu (copper) metal and has thickness of around 10 microns. The inner conductor 13 acts to electrically connect the electrical conductor layers 14, and is made of single copper component or Cu-Pd alloy (Cu: 80 weight percentages Pd: 20 weight percentages).

TABLE

| specimen No. | 1 | 2 | 3 | 4 | 5 |
| --- | --- | --- | --- | --- | --- |
| ZnO wt % | 2.5 | 3 | 3 | 3.5 | 4 |
| MgO | 12 | 14.5 | 14.5 | 15 | 13 |
| $Al_2O_3$ | 25.5 | 24.5 | 24 | 23.5 | 23 |
| $SiO_2$ | 57.5 | 56 | 55 | 56 | 58 |
| $B_2O_3$ | 2.0 | 1.5 | 2 | 1 | 1 |
| $P_2O_5$ | 0.5 | — | 1 | 1 | 1 |
| $ZrO_2$ | — | 0.5 | 1 | — | — |
| water absorption (wt %) | 0 | 0 | 0 | 0 | 0 |
| dielectric constant 10 MHz | 5.2 | 5.5 | 5.3 | 5.5 | 5.5 |
| tan δ ($\times 10^{-4}$) 10 ~ 10 MHz | below 10 | below 10 | below 10 | below 10 | below 10 |
| thermal expansion rt ~400° C. ($\times 10^{-7}$) | 25 | 27 | 26 | 30 | 27 |
| sintering temp. °C. | 950 | 950 | 950 | 950 | 950 |
| yield strength (kg/cm$^2$) | 2200 | 2600 | 2300 | 2300 | 2400 |

An outer surface conductor 12 connects the conductor layer 14 to the electrode layer 2. These conductors are densely packed in throughholes formed in the ceramic layer 11 an air-tight configuration. The electrode layer 2 is an integration of a lower layer 21, a dispersion-preventing layer 22 and an upper layer 23. Both the lower layer 21 and the upper layer 23 are made of Pd, while the dispersion-preventing layer 22 is made of a crystallizable glass material selected from the group of $MgO$, $Al_2O_3$, $SiO_2$ and $ZnO$. The dispersion-preventing layer 22 is in concentrical relationship with the outer surface conductor 12, and has a diameter of twice as great as that of the surface conductor 12, that is, sufficiently large to generally cover the entire surface of a lower dispersion layer 21a. The soldering layer 3 is made of pure silver (Ag), and generally cover the entire surface of the electrode layer 2.

The connection structure (ceramic package) thus constructed is manufactured as follows:

(1) Manufacture of Green Sheets components such as ZnO, MgCO$_3$, Al(OH)$_3$, SiO$_2$, H$_3$BO$_3$ and H$_3$PO$_4$ are provided according to the percentages specified in the above Table. These material components are mixed, the melted in a crucible under a temperature of 400°–1500° degrees centigrade. After melting the mixture, it is plunged into water to make it rapidly cool so as to vitrify it. The vitrified components are pulverized by means of an alumina ball mill to form a frit powder, the spherical diameter of which is around 2–3 microns. The frit powder thus prepared is mixed with polyvinylbutyral and plasticizer to form a green sheet of about 0.6 mm in thickness according to a well known method using doctor blade.

The green sheet is heated which the temperature rises at a rate of 100° C./h until the temperature reaches 950 degrees centigrade. The green sheet thus heated is sintered for two hours at a temperature of 950 degrees centigrade, then cooled at a rate of 200° C./h to produce a sintered body. Physical properties such as thermal expansion and the like of the sintered body are measured and should be as indicated in the above Table.

(2) Manufacture of Ceramic Package

Three green sheets are prepared and punched at predetermined positions to form throughholes which are to be packed with Cu or Cu-Pd metallized layer.

Pt is applied an outer surface of the green sheet which is arranged at the uppermost layer to form a Pt-metallized layer, which is to form the lower layer of the electrode layer after sintering. On the outer surface of another of the green sheets, Cu is coated to form a Cu-metallized layer by means of printing, which Cu-metallized layer is to form an electrical conductor layer after sintering.

Afterward, an insulating paste layer is applied to the green sheets around the throughholes in concentrical relationship with the throughholes. The insulating paste layer is made of crystallized glass, and the diameter of the paste layer is generally twice as great as that of the throughholes. The paste, which is to form the dispersion-preventing layer, has components identical to those of the green sheets.

A Pt-metallized layer is provided to cover the entire surface of the paste to form an upper layer Pt-metallized layer to be electrically connected to a lower Pt-metallized layer. The upper layer forms an upper electrode layer after sintering.

Upon completing each layer by means of printing, each sheet is laminated by a predetermined procedure, and hot pressed to integrate the various layers with each other.

The integrated sheets are held for five hours at a temperature of 300 degrees centigrade to remove organic components from the metallized layer and the ceramic sheets. Further, the integrated sheets are held for one hour under atmospheric conditions at a temperature of 600–750 degrees centigrade to remove residual carbon gas.

Then, the integrated sheets are placed in an atmosphere of gaseous amomonia (NH$_3$) at a temperature of 350–750 degrees centigrade so as to reduce CuO to Cu metal.

Further, the integrated sheets are held for about one hour in an atmosphere of gaseous ammonia or in a neutral gaseous atmosphere at a temperature of 900–1000 degrees centigrade to integrally sinter the metallized layers and the ceramic so as to form a ceramic package.

(3) Manufacture of Package:

An outer terminal (pin) 4 is connected to the upper layer by way of the soldering layer 3. Then, to the outer surface of the pin 4 and the metallized layers, a thin layer of Ni or Au is applied by means of electrical plating so as to complete the package.

As understood from the foregoing description, the dispersion-preventing layer prevents copper metal from joining silver metal (Ag) so as to avoid amalgamation.

The electrical conductor is made of relatively inexpensive Cu or Cu-Pd alloy, thus contributing to cost-saving.

With the dispersion-preventing layer made of crystallized glass, the following advantages are obtained.

(i) The crystallized glass protects against the formation of pinholes of therein so as to produce a fine-grained layer which imparts enhanced yield strength.

(ii) Simple sintering and cooling enables crystallization of the glass.

(iii) The amount of thermal expansion of the crystallized glass is smaller than that of alumina, but similar to that of the silicon semi-conductor chip.

(iv) The dielectric constant of the crystallized glass is lower than that of alumina ($\epsilon = 9$).

(v) The crystallized glass can be sintered at a temperature as low as 950 degrees centigrade.

It is noted that a combination of Pt and Au or a combination of Pd and Au may be employed as a combination of an electrode layer and an electrical conductor.

The green sheets may be sintered under atmospheric conditions after components of resin are removed. The ceramic materials may be ones which can be sintered at a relatively low temperature of 800–1100 degrees centigrade.

Further, it is appreciated that instead of a PGA ceramic package, other types of packages such as DIP, flat or leadless types may be used.

It will be understood that various changes and modifications may be made in the above described systems which provide the characteristics of this invention without departing from the spirit thereof.

What is claimed is:

1. A device for connecting an electrical conductor layer on a surface of a first ceramic body to an outer terminal, said device comprising a connection structure of:

an outer surface conductor connected to an electrical conductor layer on a surface of a first ceramic body and extending through a throughhole in a second ceramic body;

a lower conductive layer formed over and in electrical connection with an outer end of said outer surface conductor, said lower conductive layer having an area greater than an area of said outer end of said outer surface conductor;

a dispersion-preventing layer formed on a portion of said lower conductive layer concentric with said outer end of said outer surface conductor, said dispersion-preventing layer having an area greater than an area of said outer end of said outer surface conductor but less than said area of said lower conductive layer, said dispersion-preventing layer being made of a crystallized glass;

an upper conductive layer formed over said dispersion-preventing layer and a portion of said lower conductive layer, said upper conductive layer having an area greater than an area of said dispersion-preventing layer but less than said area of said lower conductive layer; and a soldering conductive layer formed over said upper layer and a portion of said lower conductive layer in electrical contact with said upper conductive layer and said lower conductive layer, said outer terminal being connected to said soldering layer.

2. The device of claim 1, wherein said crystallized glass is formed of the same material as said first and second ceramic bodies.

3. The device of claim 1, wherein said crystallized glass is formed of a material selected from the group consisting of MgO, $Al_2O_3$, $SiO_2$ and ZnO.

4. The device of claim 1, wherein said lower conductive layer and said upper conductive layer are formed on Pd.

5. The device of claim 1, wherein said soldering layer is formed of Ag.

6. The device of claim 1, wherein said outer surface conductor is formed of a metal selected from the group consisting of Cu and Au.

7. The device of claim 1, wherein the diameter twice the diameter of said outer end of said outer surface conductor.

* * * * *

UNITED STATES PATENT AND TRADEMARK OFFICE
CERTIFICATE OF CORRECTION

PATENT NO.   : 5,003,131

DATED        : March 26, 1991

INVENTOR(S)  : Asao Morikawa and Kazuo Kondo

It is certified that error appears in the above-identified patent and that said Letters Patent is hereby corrected as shown below:

On the title page Assignee should read as follows:
Item 73: Assignee: NGK Spark Plug Co., Ltd., Nagoya, JAPAN

Signed and Sealed this

Twenty-fifth Day of August, 1992

Attest:

DOUGLAS B. COMER

*Attesting Officer*   *Acting Commissioner of Patents and Trademarks*